United States Patent
Zhou et al.

[11] Patent Number: 5,844,937
[45] Date of Patent: Dec. 1, 1998

[54] MATCHED FILTER SYSTEM

[75] Inventors: Changming Zhou; Guoliang Shou; Makoto Yamamoto; Kenzo Urabe; Sunao Takatori, all of Tokyo, Japan

[73] Assignees: Kokusai Electric Co., Ltd.; Yozan, Inc., both of Tokyo, Japan

[21] Appl. No.: 744,954

[22] Filed: Nov. 7, 1996

[30]     Foreign Application Priority Data

Nov. 10, 1995 [JP] Japan .................................. 7-315771

[51] Int. Cl.$^6$ .................................................. H04B 15/00
[52] U.S. Cl. ........................................... 375/207; 375/343
[58] Field of Search ........................... 370/515; 375/200, 375/206, 207, 343

[56]              References Cited

U.S. PATENT DOCUMENTS

| | | | |
|---|---|---|---|
| 5,352,301 | 10/1994 | Mitzlaff .................................. | 375/200 |
| 5,757,845 | 5/1998 | Fukawa et al. ......................... | 375/200 |
| 5,757,870 | 5/1998 | Miya et al. ............................. | 375/367 |

OTHER PUBLICATIONS

"Development of Low Power Consumption LSI for SS Communication," Tanaka et al., Technical Report of IEICE, SST95–77 (1995–10).

"Development of 1 Chip SS Communication LSI Using Digital Matched Filters," Ogawa et a., Technical Report of IEICE, ISEC94–92, SST94–65 (1994–12).

Dual 64– TAP, 11 Mcps Digital Matched Filter/Correlator, STEL–3310, Stanford Telecommunication, 1990.

*Primary Examiner*—Stephen Chin
*Assistant Examiner*—Joseph Roundtree
*Attorney, Agent, or Firm*—Pillsbury Madison & Sutro LLP

[57]                ABSTRACT

The present invention solves the conventional problems and has an object to provide a matched filter system of high process in speed, a small size and low electric power consumption. The matched filter circuits of each matched filter set is allocated different n combinations of M/n digits selected from the M length PN code sequence picking one out of every n digits, cyclically performs sampling every 1 chip time duration the input signals to be inputted to each set constructed by matched filter circuits by n sets each of which including n matched filter circuits, and calculates the sum of outputs of all matched filter circuits.

18 Claims, 6 Drawing Sheets

MATCHED FILTER SYSTEM

FIELD OF THE INVENTION

The present invention relates to a matched filter system for a spread spectrum communication system of mobile and personal radio and a wireless LAN.

BACKGROUND OF THE INVENTION

A matched filter is a filter for judging the identification of two signals. In the spread spectrum communication, unique spreading code sequences are allocated to users. Each user finds a signal transmitted for the user by a matched filter to which one spreading code sequence is applied. The matched filter outputs correlation peak when the signal is the user's for a acquisition and holding.

Assuming a spreading code to be PN(i), a tip time to be Tc, length of the PN code sequence to be M, a time to be (t), an input signal on a time t to be S(t) and a correlational output signal on a time t to be R(t), the formula (1) can be obtained. The length M of PN code sequence is number of digits constructing the M length PN code sequence and is also called "spreading ratio".

$$R(t) = \sum_{i=0}^{M-1} PN(i) \cdot S(t - i \cdot Tc) \quad (1)$$

Here, PN(i) is a 1 bit data sequence.

As double or higher order of sampling is necessary for the acquisition, the calculation of the formula (1) is performed in a plurality of systems at the same time using a plurality of matched filters and the calculation results are added. In order to realize such "a matched filter system" (a combination of a plurality of matched filters and other circuits is represented by this expression), a digital circuit or a SAW (Surface Acoustic Wave) device was conventionally used. However, when using a digital circuit, the electric power consumption was large because the size of a circuit was large, therefore, it was not appropriate to a mobile communication. When using a SAW element, it was not easy to realize a whole circuit by a LSI device and the S/N ratio was low.

SUMMARY OF THE INVENTION

The present invention solves the conventional problems and has an object to provide a matched filter system of high process speed, a small size and low electric power consumption.

In a matched filter circuit according to the present invention, the matched filter circuits of each matched filter set are allocated different n combinations of M/n digits selected from the M length PN code sequence picking one out of every n digits, cyclically performs sampling every chip time duration the input signals to be inputted to each set constructed by matched filter circuits by n sets each of which including n matched filter circuits, and calculates the sum of outputs of all matched filter circuits.

PREFERRED EMBODIMENT OF THE PRESENT INVENTION

Hereinafter the first embodiment of the matched filter circuit according to the present invention is described with reference to the attached drawings.

Figure 1:
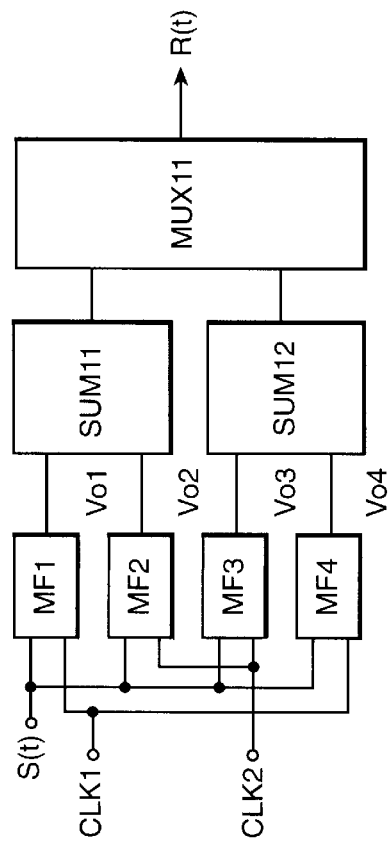
FIG. 1 shows a block diagram of an embodiment of the matched filter system according to the present invention.

In FIG. 1, the matched filter system consists of four matched filter circuits MF1, MF2, MF3 and MF4 which are classified into two groups. These matched filter circuits have taps of a half number of the number of PN codes. When a PN code is expressed by PN(i) similar to the above, PN codes are classified into two groups.

The First Group: a*PN(i)

$a=(i+1) \bmod 2$

The Second Group: b*PN(i)

$b=i \bmod 2$

With respect to an input signal S(t−i*Tc), when t=j*Tc (j is an integer), it is classified into two groups below according to whether (j−i) is an even or odd number.

The First Group: c*S(t−i*Tc)

$c=(|j-i|+1) \bmod 2$

The Second Group: d*S(t−i*Tc)

$d=|j-i| \bmod 2$

Using these expression, formula (1) can be rewritten as formula (2).

$$R(t) = \sum_{t=0}^{M-1} \{(a+b)PN(i)\}\{(c-d)S(t-i \cdot Tc)\} \quad (2)$$

When expanding the formula (2), formula (3) can be obtained.

$$R(t) = \quad (3)$$

$$\sum_{i=0}^{M-1} \{aPN(i)\}\{(cS(t-i \cdot Tc)\} + \sum_{i=0}^{M-1} \{bPN(i)\}\{(dS(t-i \cdot Tc)\} +$$

$$\sum_{i=0}^{M-1} \{aPN(i)\}\{(dS(t-i \cdot Tc)\} + \sum_{i=0}^{M-1} \{bPN(i)\}\{(cS(t-i \cdot Tc)\}$$

The matched filter is settled corresponding to the four combinations of even or odd of the PN codes and even or odd of input signals. aPN(i) and bPN(i) are settled as multiplier in MF1 and MF3, and in MF2 and MF4, respectively. A clock CLK1 with a frequency of a half chip rate is input to MF1 and MF4. A clock CLK2 with the same frequency and inverse phase is input to MF2 and MF3. When CLK1 is a clock corresponding to the signal in odd group, that is, a clock for inputting c*S(t−i*Tc), multiplications are performed in MF1 and MF4 corresponding to the signal in odd group, and the calculations of the first and the fourth terms in the formula (3) are performed. Therefore, calculations corresponding to the signal in even group are performed in MF2 and MF3, find the calculations of the second and the third terms in the formula (3) are performed. Assuming outputs of matched filter circuits MF1, MF2, MF3 and MF4 to be Vo1, Vo2, Vo3 and Vo4, these can be expressed as in formulas (4) to (7).

$$Vo1 = \sum_{i=0}^{M-1} \{aPN(i)\}\{(cS(t-i \cdot Tc)\} \quad (4)$$

$$Vo2 = \sum_{i=0}^{M-1} \{bPN(i)\}\{(dS(t-i \cdot Tc)\} \quad (5)$$

$$Vo3 = \sum_{i=0}^{M-1} \{aPN(i)\}\{(dS(t-i \cdot Tc)\} \quad (6)$$

$$Vo4 = \sum_{i=0}^{M-1} \{bPN(i)\}\{(cS(t-i \cdot Tc)\} \quad (7)$$

Vo1 and Vo2 are input to an addition circuit SUM11, Vo3 and Vo 4 are input to an addition circuit SUM12, and outputs of these addition circuits are alternately output by a multiplexer MUX11. A correlation output R(t) of the formula (3) can be obtained by it. In the structure above, the frequency of the clock CLK1 and CLK2 are half of that of ordinary matched filter, therefore, the speed of the processing can be lowered. It is effective not only for reducing the manufacturing cost and electric power consumption but also for processing in high speed exceeding the limit of the performance of MOSFET.

Figure 2:
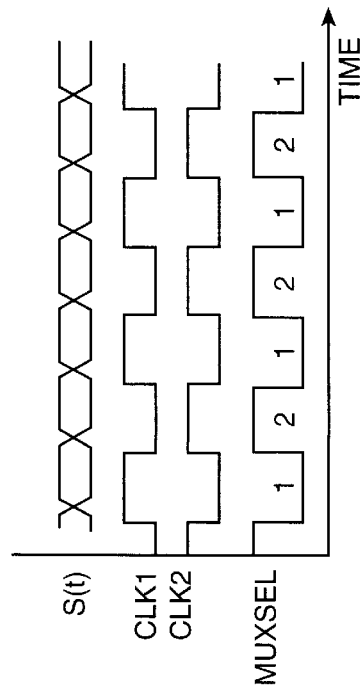
FIG. 2 shows a timing chart of the embodiment.

The timing chart of the circuit in FIG. 1 is shown in FIG. 2. The CLK 1 and CLK2 are settled so that an input signal S(t) is alternately performed sampling and holding every Tc. A selecting signal of MUX11 MUXSEL is a signal with the same cycle as CLK1 or CLK2. The MUXSEL alternately switches outputs of SUM11 and SUM12 by the cycle of Tc, and selectively outputs them.

The formula (3) can be generalized by the calculation with combination of M/n digits (natural number: n=2 in the embodiment above) and input signals corresponding to them. A correlation output R(t) is expressed as an intermittent one by the chip time Tc. The time t is recognized as a discrete value.

$$R(l \cdot Tc - t_0) = \sum_{j=0}^{M/n-1} \sum_{k=0}^{n-1} PN(nj+k) \cdot S((l \cdot Tc + t_0) - (nj+k) \cdot Tc) \quad (8)$$

l: a natural number $t_o$: a point of time started the processing of the matched filter (successive time)

j: a natural number for giving codes every number of (n−1)

k: a natural number for giving an attribute of PN codes

When M/n is not an integer, the formula (8) can be rewritten into a formula (9).

$$R(l \cdot Tc + t_o) = \quad (9)$$

$$\sum_{j=0}^{[M/n]-1} \sum_{k=0}^{n-1} PN(nj+k) \cdot S((l \cdot Tc + t_0) - (nj+k) \cdot Tc) +$$

$$\sum_{k=0}^{(M \bmod n)-1} PN(n[M/n]+k) \cdot S((l \cdot Tc - t_0) - (n[M/n]+k) \cdot Tc)$$

In the formula (9), [x] is a Gauss' notation, which means the maximum number of integers not more than a real number x. Only the formula (8) is described so as to simplify the problem.

In the formula (8) above, when the time (1*Tc) is expressed by a discrete value of every n tip time, n number of formulas (10) can be obtained.

$$R(mn \cdot Tc + t_0) = \sum_{j=0}^{M/n-1} \sum_{k=0}^{n-1} PN(nj-k) \cdot \quad (10)$$

$$S((mn \cdot Tc + t_o) - (nj+k) \cdot Tc)$$

$$R((mn+1) \cdot Tc + t_0) = \sum_{j=0}^{M/n-1} \sum_{k=0}^{n-1} PN(nj+k) \cdot$$

$$S(((mn+1) \cdot Tc + t_o) - (nj-k) \cdot Tc)$$

---

$$R((mn-n-1) \cdot Tc + t_0) = \sum_{j=0}^{M/n-1} \sum_{k=0}^{n-1} PN(nj+k) \cdot$$

$$S(((mn+n-1) \cdot Tc + t_o) - (nj+k) \cdot Tc)$$

The formula (10) can be decomposed into partial correlation of every code group of k=0 to (n−1). Only a decomposition expression for the first formula in (10) is shown in a formula (11).

$$R(mn \cdot Tc + t_0) = \sum_{j=0}^{M/n-1} PN(nj) \cdot S((mn \cdot Tc + t_0) - nj \cdot Tc) + \quad (11)$$

$$\sum_{j=0}^{M/n-1} PN(nj+k) \cdot S((mn \cdot Tc + t_0) - (nj+1) \cdot Tc) +$$

---

$$\sum_{j=0}^{M/n-1} PN(nj+n-1) \cdot S((mn \cdot Tc + t_0) - (nj+n-1) \cdot Tc)$$

The each term in the formula (11) is a partial correlation by each combination of M/n digits selected from the M length PN code. It can be calculated by a matched filter system in FIG. 3.

Figure 3:
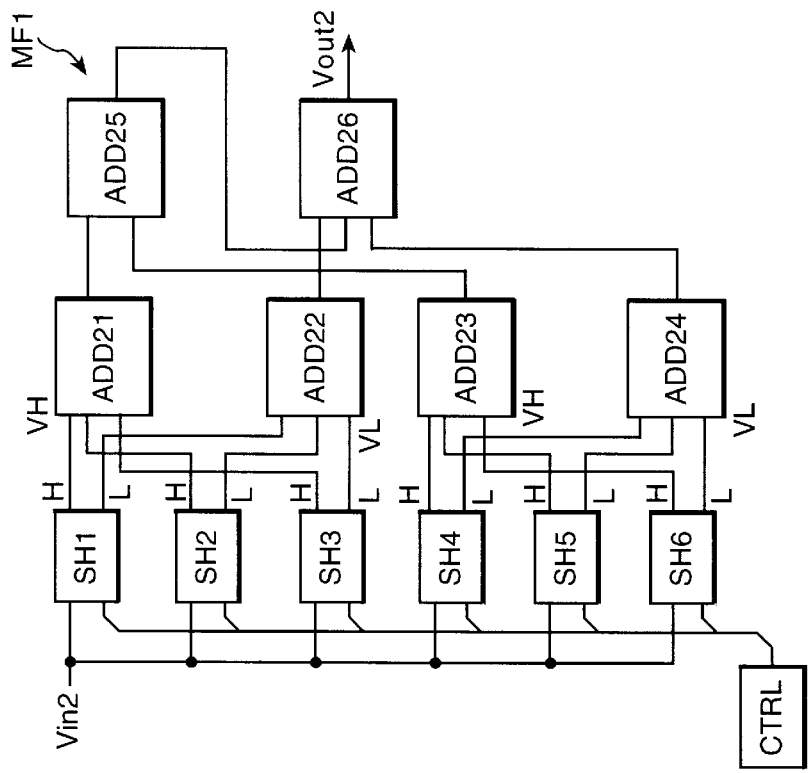
FIG. 3 shows a block diagram of each matched filter circuit of the embodiment.

In FIG. 3, in the matched filter circuit, an input voltage Vin2 is parallelly connected to a plurality of sampling and holding circuits SH1, SH2, SH3, SH4, SH5 and SH6, and two types of outputs of H (high) and L (low) are generated from each sampling and holding circuit. A control circuit CTRL is connected to the sampling and holding circuit so as to control Vin2 to be input to one of the sampling and holding circuits, successively.

The sampling and holding circuit introduces the input voltage Vin2 to either II side or L side according to the control of the control circuit. A reference voltage Vr is connected by the control circuit to the other side. This route selection is performed according to each bit of spreading code (PN code) and a multiplication of input voltage by the code is accomplished only by this selection.

Figure 5:
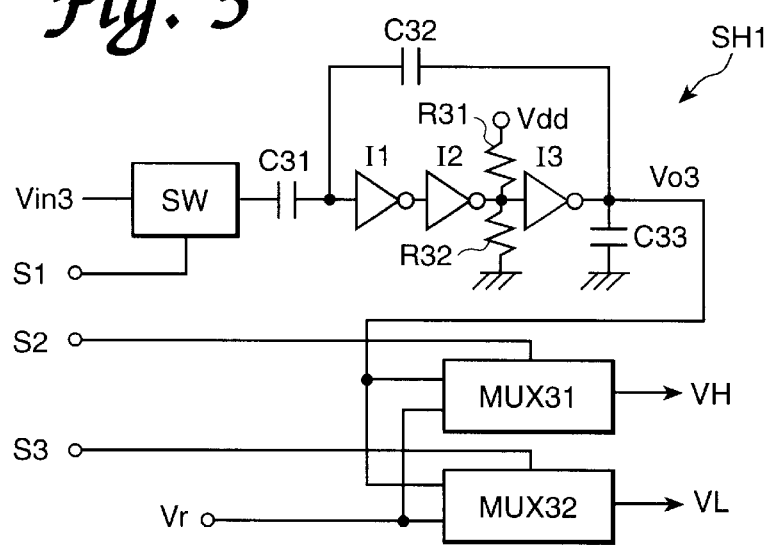
FIG. 5 shows the sampling and holding circuit in FIG. 3.

The sampling and holding circuit SH1 is structured as in FIG. 5, in which an input voltage Vin3 is connected to a switch SW. An output of switch SW is connected to capacitance C31, and three stages of serial MOS inverters I1, I2 and I3 are connected to an output of capacitance C31. An output of MOS inverter I3 of the last stage is connected to an input of I1 through feedback capacitance C32. Consequently, an inversion of Vin3 is generated at the output of I3 with a good linearity. An output of I3 is input to two multiplexers MUX31 and MUX32. A common reference voltage Vr is connected to the multiplexers. When SW is closed, C1 is charged by an electric charge corresponding to Vin3, and the linearity of an output is guaranteed by a feed-back function of I1 to I3. When a switch SW is open after it, sampling and holding circuit SH1 holds Vin3.

Switch SW, multiplexers MUX31 and MUX32 are controlled by control signals S1, S2 and S3. After S1 is once closed, SW is opened at the timing of sampling of the input voltage. S2 and S3 are inverted signals. When one of the multiplexers outputs Vin3, the other outputs Vr.

MUX31 generates an outputs of H (high type) above and MUX32 generates an output of L (low type). H and L correspond to each bit of the spreading codes "1" and "−1". When the code "1" is to be multiplied to an input voltage, Vin3 is output from MUX31, and when the code "−1" is to be multiplied, Vin3 is output from MUX32.

The output from I3 of the last stage is connected to the ground through a grounded capacitance C33. The output of I2 of the second stage is connected to the supply voltage Vdd and the ground through a pair of balancing resistances R31 and R32. Unstable oscillations of an inverted amplifying circuit including feedback circuit is prevented by such a structure.

Figure 6:
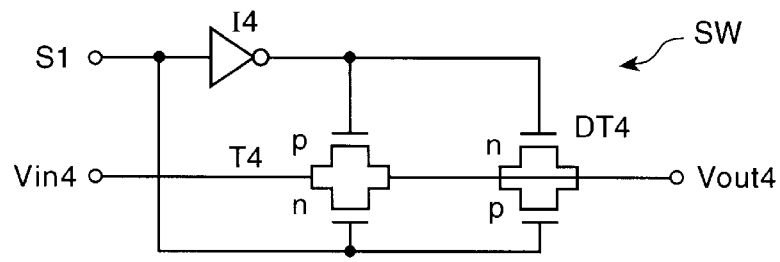
FIG. 6 shows the switch in FIG. 3.

As shown in FIG. 6, the switch SW includes a transistor circuit T4 in which a source and a drain of a n-type MOS transistor are connected to a drain and a source of a p-type MOS transistor, respectively. Vin4 is connected to a terminal of a drain of the nMOS of the transistor circuit and a terminal of a source of nMOS is connected to an output terminal Vout4 through a dummy transistor DT4 similar to the nMOS. S1 is input to the gate of the nMOS transistor of the transistor circuit T4, and an inverted signal of S1 by an inverter I4 is input to the gate of pMOS transistor. When S1 is high level, T4 is conductive and when it is low level, T4 is cut off.

Figure 7:
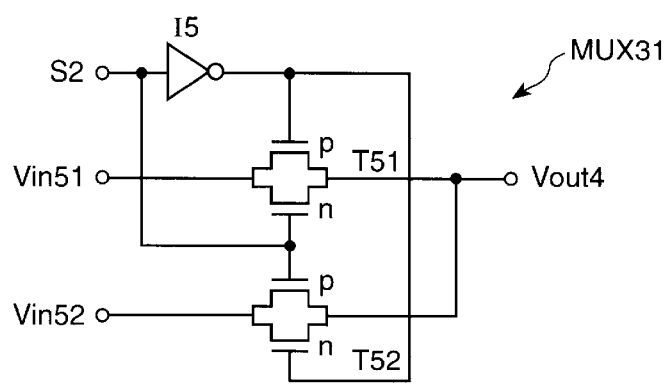
FIG. 7 shows the multiplexer in FIG. 3.

As shown in FIG. 7, in multiplexer MUX31, the terminal of the source of nMOS of transistor circuits T51 and T52 is connected to the common output terminal Vout4. An output Vo3 ("Vin51" in FIG. 7) of the MOS inverter I3 is connected to a terminal of a drain of the nMOS of T51, and the reference voltage Vr ("Vin52" in FIG. 7) is connected to a drain of T52. The signal S2 is input to a gate of the nMOS transistor of transistor circuit T51 and gate of the pMOS transistor of transistor circuit T52. The signal S2 inverted by inverter I5 is input to gates of the pMOS of T51 and nMOS of T52. When S2 is high level, T51 is conductive and T52 is cut off, and when low level, T52 is conductive and T51 is cut off. That is, MUX31 can alternatively output Vo3 or Vr in response to the control signal S2.

Though it is not shown in the figure, multiplexers MUX11 and MUX32 are structured similarly to MUX31 and Vo3 and Vr are connected inversely. Vr and Vo3 of FIG. 7 are connected to T51 and T52, respectively, contrary to the construction of FIG. 7. Consequently, MUX32 output inversely to MUX31; that is, when MUX31 outputs Vo3, MUX32 outputs Vr and when MUX31 output Vr, MUX32 outputs Vo3.

Signal S2 corresponds to spreading code and outputs 1×Vin2=Vin2 to AD21 when S2=1. At this time, S3 is −1 and Vr corresponding 0 is output to ADD22. When S2=1, Vr corresponding to 0 is output to ADD21. Here, S3=+1 and outputs 1×Vin2=Vin2 to ADD22.

The S(t−i*Tc) in the formula (1) is an input voltage held in each sampling and holding circuit, and PN(i) is the signal S2(spreading code) to be input to each sampling, and holding circuit. The order of the spreading codes is predetermined corresponding to the order of input signals. When a new signal is taken, the oldest signal is substituted by the newest signal. It causes change in relationship between each sampling and holding circuit SH1 to SH6 and PN(i), so PN(i) is shifted by the control circuit. When a code shift is not performed, code transfer through successive sampling and holding circuits and some errors may be generated due to data transfer. It will be understood that the code shift is effective to prevent the error during data transfer.

Figure 4:
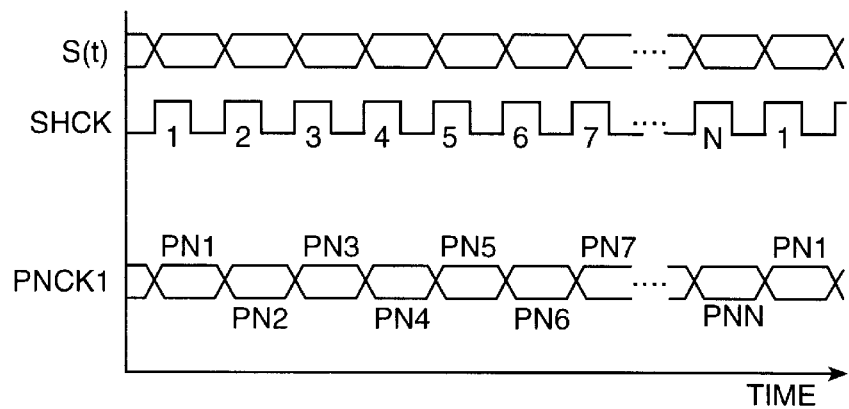
FIG. 4 shows a timing chart of the matched filter circuit.

FIG. 4 more generally shows a sampling and holding clock SHCK when N number of sampling and holding circuits exist, and PN codes for a sampling and holding circuit (the first sampling and holding circuit). The sampling and holding are performed in response to SHCK successively in the sampling and holding circuits from the first to the N-th (in the FIG. 4, numbers from 1 to N are attached to SHCK). Therefore, a sampling and holding circuit samples and holds once every period of N*Tc. N number of PN codes from PN1 to PNN are successively provided to the first sampling and holding circuit and N times of multiplication is performed for one datum.

The accumulation in formula (1) is performed in the addition portions from ADD21 to ADD26, VH and VL of output voltages of each sampling and holding circuit are accumulated in ADD25 and ADD26, respectively. This accumulation is not performed directly. Sampling and holding circuits are divided into a plurality of groups, outputs VH and VL are once accumulated in ADD21 to ADD24 for each group. All of the outputs of ADD21 and ADD23 for accumulating VH are input to ADD25, and all of the outputs of ADD22 and ADD24 for accumulating VL are input to ADD26. Further, an output of ADD25 is also input to ADD26. In FIG. 3, six sampling and holding circuits are shown which divided into two groups with three circuits. Generally a spreading code includes from 100 to several hundreds or more bits. Sampling and holding circuits are set to be an appropriate number, corresponding to the number of bits.

Figure 8:
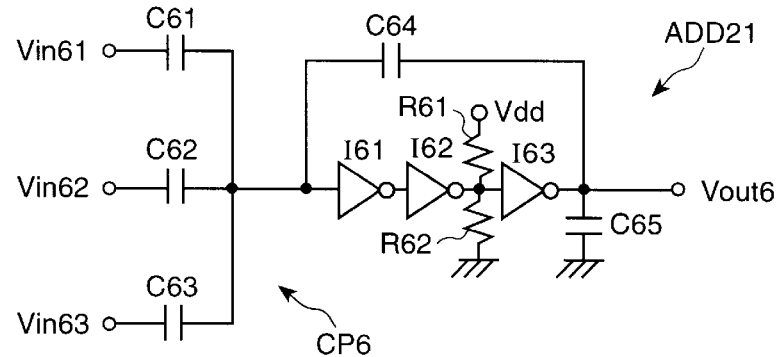
FIG. 8 shows the first adder in FIG. 3.

As shown in FIG. 8, the addition portion ADD21 includes a capacitive coupling CP6 constructed by capacitances C61, C62 and C63 of the number equal to the number of sampling and holding circuits in one group. An output of CP6 is connected to three serial stages of MOS inverters I61, I62 and I63. An output of MOS inverter I3 of the last stage is connected to an input of I61 through a feedback capacitance C64. An output of CP6 is generated at an output of I63 with a good linearity. Assuming input voltages of capacitances C61, C62 and C635 to be Vin61, Vin62 and Vin63, an output Vout6 of I63 can be expressed by the formula (12).

$$V_{out6} = \frac{C61 Vin61 - C62 Vin62 - C63 Vin63}{C64} \quad (12)$$

Here, Vin61 to Vin63 and Vout6 are voltages referencing the reference voltage Vr. Also it is defined that the capacity ratio of capacitances of C61, C62, C63 and C64 is 1:1:1:3. A normalized output of inverted addition value can be obtained as in formula (13).

$$V_{out6} = \frac{Vin61 + Vin62 + Vin63}{3} \quad (13)$$

By the normalization, the maximum voltage is limited under the supply voltage.

An output of the last stage I63 is connected to the ground through a grounded capacitance C65. An output of the second stage inverter I62 is connected to the supply voltage Vdd and the ground through a pair of balancing resistances R61 and R62. Unstable oscillation of inverted amplifying circuit including feedback line is prevented by the structure.

Figure 9:
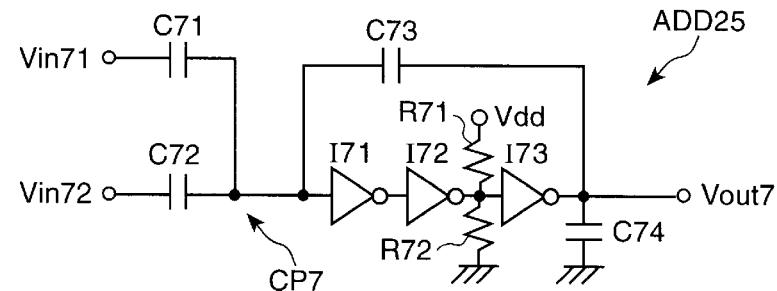
FIG. 9 shows the fifth adder in FIG. 3.

As shown in FIG. 9, the addition portion ADD25 includes a capacitive coupling CP7 which includes capacitances C71 and C72 of corresponding number to the number of the addition portions ADD21 and ADD23. The output of CP7 is connected to three stages serial MOS inverters I71, I72 and I73. An output of MOS inverter I73 of the last stage is connected to an input of I71 through a feedback capacitance C73. An output of CP7 is generated at an output of I73 with a good linearity. Assuming input voltages of capacitances C71 and C72 to be Vin71 and Vin72, an output Vout7 of I73 can be expressed by the formula (14).

$$Vout7 = -\frac{C71Vin71 - C72Vin72}{C73} \quad (14)$$

Here, Vin71 and Vin72 are voltages referencing the reference voltage Vr. the capacitance ratio is C71:C72:C73= 1:1:2. Then, a normalized output of an inverted addition is obtained as in formula (15).

$$Vout7 = -\frac{Vin71 + Vin72}{2} \quad (15)$$

By the normalization, the maximum voltage is limited under the supply voltage.

An output of the last stage inverter I73 is connected to the ground through grounded capacitance C74. An output of the second stage inverter I72 is connected to the supply voltage Vdd and the ground through a pair of balancing resistances R71 and R72. The unstable oscillation of inverted amplifying circuit including feedback line is prevented.

Figure 10:
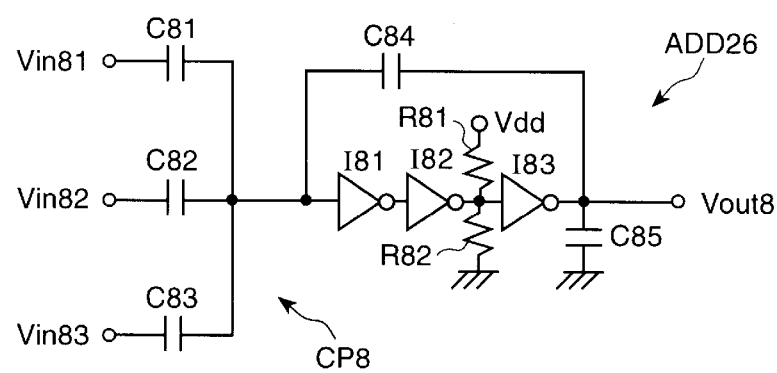
FIG. 10 shows the sixth adder in FIG. 3.

As shown in FIG. 10, addition portion ADD26 includes capacitive coupling CP8 which includes capacitances C81, C82 and C83 of the number corresponding to the number of addition portion ADD22, ADD24 and ADD25 connected thereto, and an output of CP8 is connected to three stages serial MOS inverters I81, I82 and I83. An output of MOS inverter I83 of the last stage is connected to an input of I81 through a feedback capacitance C84. An output of CP8 is generated at an output of I83 with a good linearity. Assuming input voltages of capacitances C81, C82 and C83 (the voltage referencing Vr) to be Vin81, Vin82 and Vin83, an output Vout8 of I83 (the voltage referencing Vr) can be expressed by the formula (16)

$$Vout8 = -\frac{C81Vin81 + C82Vin82 + C83Vin83}{C84} \quad (16)$$

It is defined that the capacity ratio is C81:C82:C83:C84= 1:1:2:2. A normalized output of inverted addition value can be obtained as in formula (17).

$$Vout8 = -\frac{Vin81 + Vin82 + 2Vin83}{2} \quad (17)$$

Here, the weight of C83 is defined twice as large as C81 and C82 so as to cancel the influence of the normalization by ADD25 and to agree to unnormalized V81 and V82. By the normalization, the maximum voltage is limited under the supply voltage.

An output of the last stage inverter I83 is connected to the ground through a grounded capacitance C85. An output of the second stage inverter I82 is connected to the supply voltage Vdd and the ground through a pair of balancing resistances R81 and R82. The unstable oscillation of inverted amplifying circuit including feedback is prevented.

Figure 12:
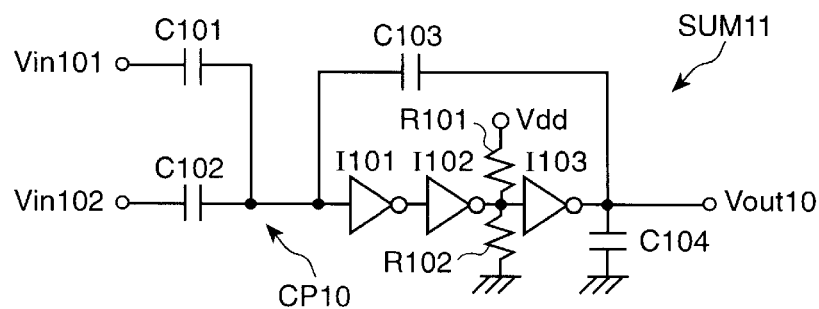
FIG. 12 shows the accumulation circuit in FIG. 1.

As shown in FIG. 12, an addition circuit SUM11 includes a capacitive coupling CP10 which consists of capacitances C101 and C102 corresponding to two matched filters MF1 and MF2. An output of it is connected to the first stage of three serial MOS inverters I101, I102 and I103. An output of the last stage MOS inverter I103 is connected to an input of I1101 through a feedback capacitance C103. An output of CP10 is generated at an output of I103. Assuming voltages (the voltage referencing Vr) input of capacitances C101 and C102 to be Vin101 and Vin1O2, an output Vout 10 of I103 (the voltage referencing Vr) can be expressed by the formula (18).

$$Vout10 = -\frac{C101Vin101 + C102Vin102}{C103} \quad (18)$$

It is defined that the capacity ratio is C101:C102:C103= 1:1:2. A normalized output of inverted addition value can be obtained as in formula (19).

$$Vout10 = -\frac{Vin101 + Vin102}{2} \quad (19)$$

By the normalization, the maximum voltage is limited under the supply voltage.

An output of the last stage inverter I103 is connected to the ground through a grounded capacitance C104. An output of the second stage inverter I102 is connected to the supply voltage Vdd and the ground through a pair of balancing resistances R101 and R102. The unstable oscillation of inverted amplifying circuit including feedback is prevented.

Figure 11:
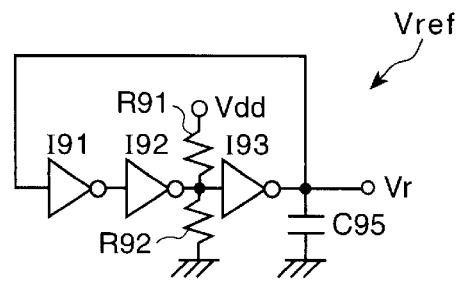
FIG. 11 shows a circuit for generating the reference voltage.

The reference voltage Vr is generated by a reference voltage generating circuit Vref in FIG. 11. The reference voltage generating circuit includes three stages serial inverters I91, I92 and I93, and an output of the last stage is fed back to the first stage input. Similarly to the inverted amplifying portions, unstable oscillation is prevented by a grounded capacitance C95 and balancing resistances R91 and R92. The output of the reference voltage circuit converges to a stable point on which an input and output voltages are equal to each other, and any reference voltage can be generated by changing the threshold of each inverter. Generally, in many cases, it is settled that Vr=Vdd/2 in order to keep dynamic range enough large in both directions of plus an minus. Here, Vdd is the supply voltage of MOS inverter.

Concerning to the matched filter circuit above, the size of the circuit is largely reduced comparing digital one because an addition is performed by an analog system of a capacitive coupling, and processing speed is high because of parallel addition. As the inputs and outputs of the sampling and holding circuit and addition portion are all voltage signal, electric power consumption is low.

The accuracy of an output of an addition portion depends on the dispersion in characteristics of MOS inverters and in capacity ratio of capacitances. The dispersion of inverters can be minimized by placing them closely to one another. The accuracy of the capacity ratio of a capacitance can be improved by dispersively connecting a plurality of unit capacitances In FIG. 13, the second embodiment of the present invention includes only two matched filter circuits of MF111 and MF112 similar to the matched filter circuits from MF1 to MF4. Their outputs Vo111 and Vo112 are added by the adder SUM. Clocks CLK1 and CLK2 are inputted to the matched filters MF111 and MF112, respectively.

In the formula (3), the combination of the first and second terms (the combination of formulas (4) and (5) and that of the third and fourth terms (the combination of formulas (6)

and (7) includes all the signal, that is, both signals of even group and odd group. When a correlation peak is detected by the calculation of formula (3) (total correlation), a correlation peak is generated in one of the combinations. Though the combination of these two terms is a partial correlation, it is possible to detect a correlation peak. That is, it is possible to realize the combinations by the matched filter circuits MF111 and MF112 to which clocks CLK1 and CLK2 are inputted, respectively.

Figure 14:
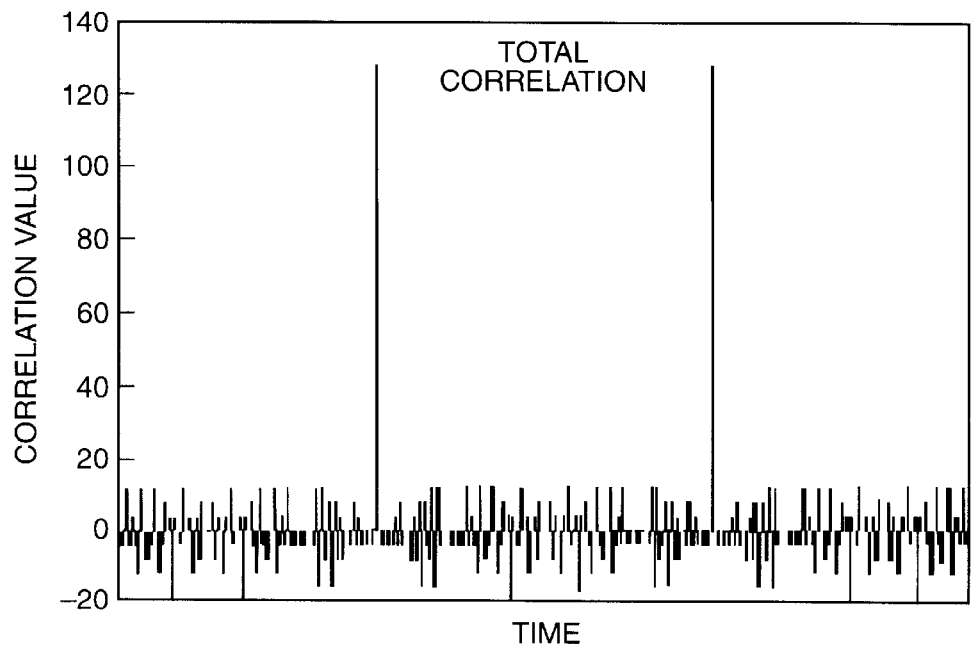
FIG. 14 shows a graph of the calculation result of the total correlation in the first embodiment.

FIG. 14 shows the result of simulations of outputs of a total correlation by a matched filter with 128 taps. A correlation peak is generated on the left end (the first timing), which reaches to approximately 128 by the level of value. Correlation outputs with numeral level equal to 20 or less are generated by other 127 times of calculations.

Figure 15:
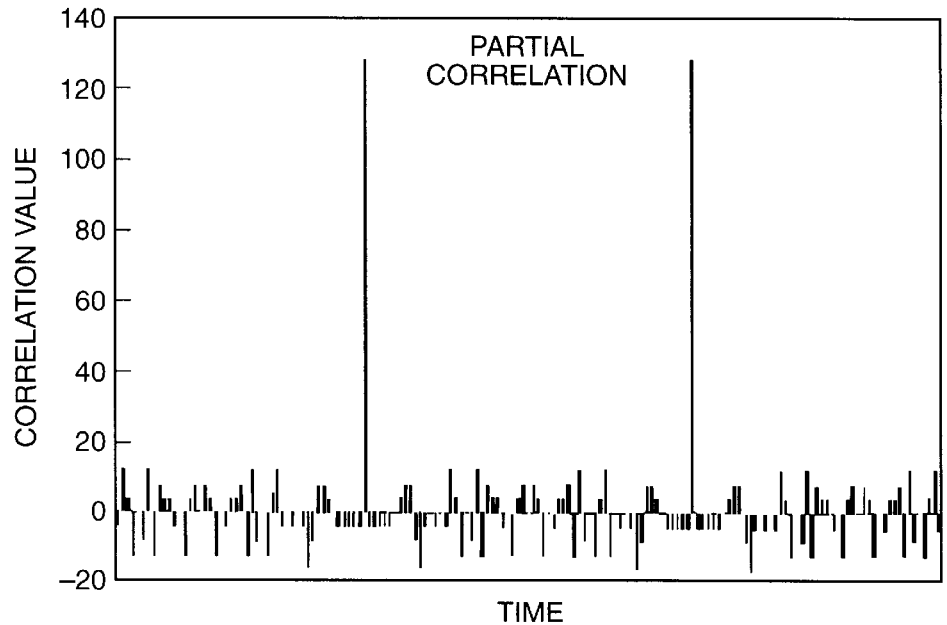
FIG. 15 shows a graph of the calculation result of the partial correlation in the second embodiment.

Correlation outputs other than that of the correlation peak are unnecessary signals in the receiving station. As each level and the total level is low, the interference is little. The result of the simulation of the partial correlation above is shown in FIG. 15, in which the same peak as the total correlation is generated. It means that a partial correlation has the same performance as the total correlation with respect to the detection of a correlation peak. As is clear from FIG. 15, other signals than the signal on the correlation peak are little by the partial correlation, therefore, the partial correlation is effective against the interference.

Figure 13:
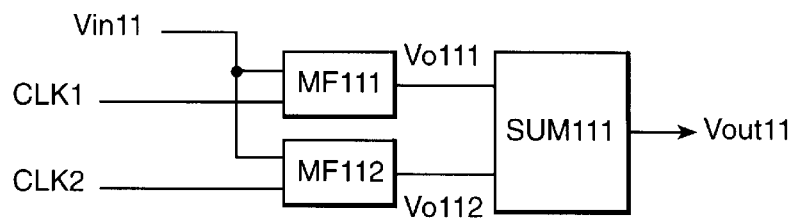
FIG. 13 shows a block diagram of the second embodiment.

By the second embodiment in FIG. 13, it is possible to detect a correlation peak with little interference and the circuit is small in addition to the first embodiment by the partial correlation. Though there may be a case that a partial correlation generates no correlation peak in the combinations above, it is possible to surely detect a correlation peak by appropriately switching clocks CLK1 and CLK2. When each matched filter circuit performs double sampling, the calculation equivalent to the total correlation is executed.

The formula (3) can be reformed as in formula (20).

$$R(t) = \sum_{i=0}^{M-1} \{(a+b)PN(i)\}\{(cS(t-i \cdot Tc)\} + \sum_{i=0}^{M-1} \{(a+b)PN(i)\}\{(dS(t-i \cdot Tc)\} \quad (20)$$

It is possible to calculate a total correlation by a multiplication combined by two groups when both i-th (i=0 to M−1) PN codes of odd group and even group are added and multiplied to an input signal. In the structure in FIG. 11, the total correlation can be calculated when the multiplication with the multiplier (a+b) can be performed by matched filter circuits MF111 and MF112. As the multipliers a and b are binary, the sum becomes three values of −1, 0 and 1. It can be processed only by the change of the control of the sampling and holding circuit SH1 in FIG. 5.

In FIG. 5, by the first embodiment, either of multiplexers MUX31 or MUX32 outputs an input voltage and another outputs Vr. When a total correlation is calculated by the structure in FIG. 11, the input voltage Vin3 is outputted from MUX31 and Vr is outputted from MUX32 in response to "+1", Vr is outputted from both of MUX31 and MUX32 in response to "0", and Vin3 is outputted from MUX32 and Vr is outputted from MUX32 in response to "−1". The multiplication corresponding to the three values can be realized by it, and a total correlation calculation is possible by two matched filters. The sampling clock of it is the half of the conventional frequency of a clock.

Figure 16:
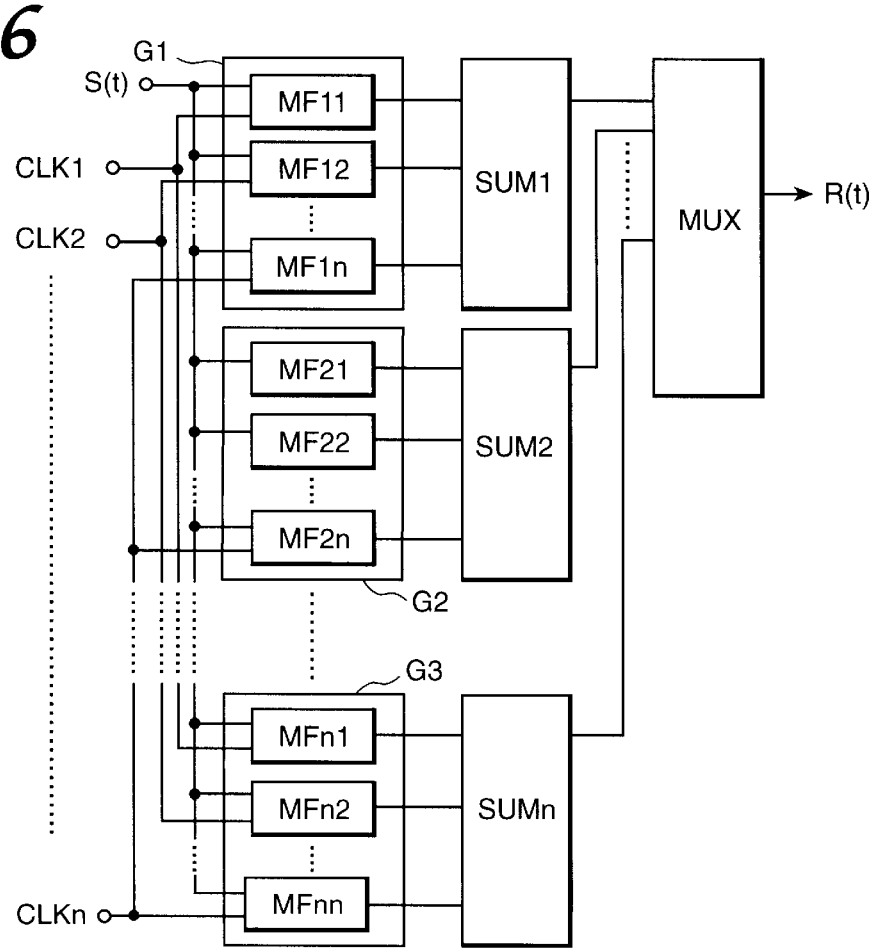
FIG. 16 shows a block diagram of the third embodiment.

FIG. 16 shows a matched filter system comprised of n sets of groups G1 to Gn each of which includes n number of matched filter circuits. A calculation corresponding to the formula (10) can be performed by it. The G1 consists of matched filter circuits MF11 to MF1n with (M/n) taps, outputs of which are added by an adder SUM1. Similar to it, the group Gn consists of matched filter circuits MFn1 to MFnn, outputs of which are added by a SUMn. Outputs of these addition circuits are input to a multiplexer MUX and an output of one of addition circuits is selectively outputted. A common clock CLKi is input to an i-th (first, for example) matched filter circuit of each group, and a sampling and holding is performed in response to CLKi. The speed of the clock of each matched filter circuit can be decreased.

Figure 17:
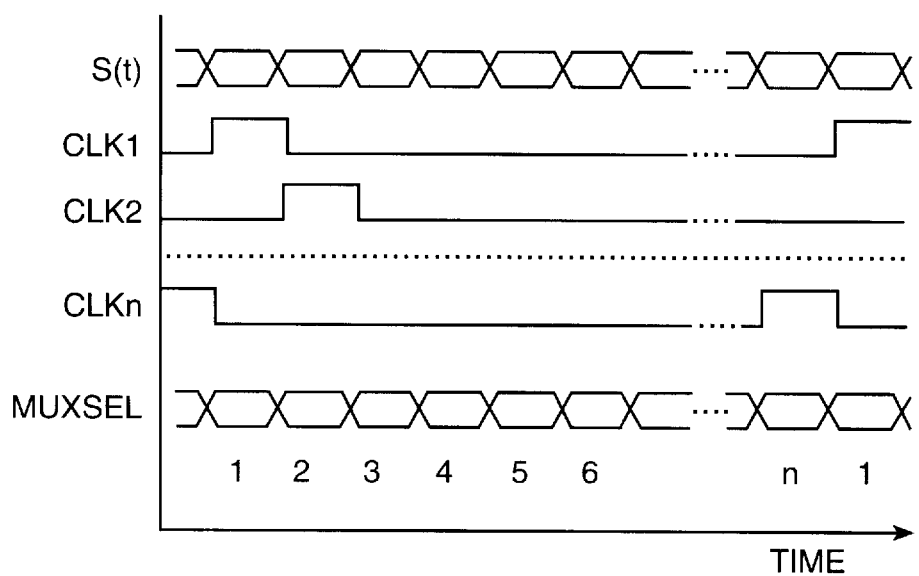
FIG. 17 shows the timing chart of the third embodiment.

FIG. 17 shows the timing chart of the system in FIG. 16. CLK1-to CLKn become high level successively during the period Tc with the timing shifted by Tc, and a switching signal of a multiplexer MUXSEL successively selects G1 to Gn.

In such a structure, a partial correlation can be calculated by settling only one or a plurality of groups. Therefore, it is possible to detect a correlation peak surely in high speed by a circuit of small size similar to the above embodiment.

In a matched filter circuit according to the present invention, the matched filter circuits of each said matched filter set are allocated n combinations of M/n digits selected from the M length PN code sequence picking one out of every n digits as multipliers of two matched filter circuits, the input signals are alternately performed sampling every chip time duration and the sum of outputs of both matched filter circuits are calculated. Therefore, it is possible to detect a correlation peak by partial peak. A small and low speed circuit is enough for it, and the interference of output decreases. It is also possible to realize a high speed calculation exceeding the limit of the element of the conventional structure.

What is claimed is:

1. A matched filter system for multiplying a predetermined PN code sequence to a plurality of spread spectrum signals of time series and calculating an accumulated value of them, comprising:

i) n groups of matched filter sets each of which includes n matched filter circuits having M/n taps, said matched filter circuits of each said matched filter set being allocated different n combinations of M/n digits selected from the M length PN code sequence picking one out of every n digits, said matched filter circuits of each said matched filter set being provided sampling clocks for sampling said spread spectrum signal of a period of n*Tc, said sampling clocks being staggered by an offset time of Tc for said matched filter circuits in each said matched filter set,
   where,
   M: length of said PN code sequence,
   n: a measure of M, and
   Tc: chip time duration of said matched filter circuit;

ii) a plurality of addition circuits corresponding to said matched filter groups, each of which adds total outputs of said matched filters of one of said matched filter groups; and iii) a multiplexer for selectively outputting an output of said addition circuits.

2. A matched filter system for multiplying a predetermined PN code sequence to a plurality of spread spectrum signals of time series and calculating an accumulated value of them, comprising;

i) n groups of matched filter sets each of which includes n matched filter circuits having taps and one matched filter having (M mod n) taps, said matched filter circuits of each said matched filter set being allocated different n combinations of M/n digits selected from the M length PN code sequence picking one out of every n digits, said matched filter circuits of each said matched filter set being provided sampling clocks for sampling said spread spectrum signal of a period of n*Tc, said sampling clocks being staggered by an offset time of Tc for said matched filter circuits in each said matched filter set, where, M: number of PN codes of said PN code sequence, n: a measure of M, ] [: a Gauss' notation, and Tc: chip time of said matched filter circuit;

ii) a plurality of addition circuits corresponding to said matched filter groups, each of which adds total outputs of said matched filters of one of said matched filter groups; and iii) a multiplexer for selectively outputting an output of said addition circuits.

3. A matched filter system as claimed in claim 1, wherein a number of matched filter groups is less than n.

4. A matched filter system as claimed in claim 1, wherein only a part number of matched filter groups is one, an output of said one matched filter group is output as a final output of said matched filter system.

5. A matched filter system as claimed in claim 1, wherein n is value of power of 2.

6. A matched filter system as claimed in claim 1, wherein n=2.

7. A matched filter system for multiplying a predetermined PN code sequence to a plurality of spread spectrum signals of time series and calculating an accumulated value of them, comprising:

i) the first matched filter circuit with taps of a half number of PN codes of said PN code sequence, in which every other PN codes in said PN code sequence are applied to said taps;

ii) the second matched filter circuit with other half number of PN codes than said PN codes applied to said first matched filter;

iii) a clock generating circuit for generating two clocks of opposite phases to each other of a half frequency of a chip rate, as sampling clocks of said first and second matched filter circuits; and iv) an adder for adding outputs of said matched filter circuits.

8. A matched filter system for a spread spectrum communication as claimed in claim 1, each said matched filter circuit comprising:

(I) a plurality of sampling and holding circuits which comprises;

i) a switch connected to an input voltage, ii) the first capacitance connected to an output of said switch, iii) the first inverted amplifying portion having odd number of stages of MOS inverters connected to an output of said first capacitance, iv) the first feedback capacitance for connecting an output of said first inverted amplifying portion to its input, and v) the first and the second multiplexers for alternatively outputting an output of said first inverted amplifying portion or a reference voltage;

(II) the first addition portion which comprises;

i) a plurality of the second capacitances corresponding to said sampling and holding circuit, to each of which an output of each said sampling and holding circuit is connected, ii) the second inverted amplifying portion having odd number of stages of MOS inverters to which outputs of said second capacitances are commonly connected, and iii) the second feedback capacitance for connecting an output of said second inverted amplifying portion to its input;

(III) the second addition portion which comprises;

i) a plurality of the third capacitances corresponding to said sampling and holding circuit, each of which an output of said second multiplexer and an output of said first addition portion of each sampling and holding circuit, ii) a third inverted amplifying portion having odd number of stages of MOS inverters to which outputs of said third capacitance are integrated and connected, and iii) a third feedback capacitance for connecting an output of said third inverted amplifying portion to its input;

(IV) a subtraction portion for subtracting an output of said second addition portion from an output of said first addition portion, and (V) a control circuit for closing said switches in one of said sampling and holding circuits as well as opening other switches and switching said first and second multiplexers of each sampling and holding circuit by a predetermined combination.

9. A matched filter system as claimed in claim 8, wherein said sampling and holding circuits are classified into groups each of which comprises:

(I) the fourth addition portion to which an output of said first multiplexer is connected, outputs of said fourth addition portion of all of said groups being inputted to said second addition portion, said fourth addition portion comprising:

(a) a plurality of fourth capacitances to each of which an output of said first multiplexer of each said sampling and holding circuit is connected;

(b) the fourth inverted amplifying portion with odd number of serial MOS inverters, to which outputs of said fourth capacitances are commonly connected; and (c) the fourth feedback capacitance for connecting an output said fourth inverted amplifying portion to its input, and (II) the fifth addition portion to which said second multiplexer is connected, outputs of said fifth addition portion of all of said groups being inputted to said first addition portion, said fifth addition portion comprising:

(a) a plurality of fifth capacitances to each of which an output of said second multiplexer of each said sampling and holding circuit and an output of said first addition portion are inputted;

(b) the fifth inverted amplifying portion with odd number of serial MOS inverters, to which outputs of said fifth capacitances are commonly connected; and (c) the fifth feedback capacitance for connecting an output said fifth inverted amplifying portion to its input.

10. A matched filter system as claimed in claim 8, wherein said reference voltage is generated by a reference voltage generating circuit which comprises a sixth inverted amplifying portion consisting of an odd number of stages of MOS inverter and a sixth feedback capacitance for connecting an output of said sixth inverted amplifying portion to its input.

11. A matched filter system as claimed in claim 8, further comprising a grounded capacitance connected between an output of the last MOS inverter of said inverted amplifying portion and the ground, and a balancing resistances connecting other MOS inverters than the last stage to a supply voltage and the ground.

12. A matched filter system as claimed in claim 8, wherein said reference voltage is settled to be ½ of a supply voltage of said MOS inverter.

13. A matched filter system as claimed is claim 8, wherein said control circuit controls said all sampling and holding circuits so that status of said sampling and holding circuits circularly changed.

14. A matched filter system as claimed in claim 8, wherein said first multiplexer alternatively outputs said output of said first inverted amplifying portion or said reference voltage, and said second multiplexer alternatively outputs said output of said first inverted amplifying portion or said reference voltage by opposite selection of said first multiplexer.

15. A matched filter system as claimed in claim 8, wherein one of said first and second multiplexer outputs said output of said first inverted amplifying portion, or both of them output said reference voltage.

16. A matched filter system as claimed in claim 7, further comprising:

i) the third matched filter circuits with taps of a half number of PN codes, to which PN code sequence the same as said first matched filter circuit are applied as multipliers, and a clock of a phase the same as said second matched filter circuit is applied, ii) the fourth matched filter circuits with taps of a half number of PN codes, to which PN code sequence the same as said second matched filter circuit are applied as multipliers, and a clock of a phase the same as said first matched filter circuit is applied.

17. A matched filter system as claimed in claim 7, wherein said clocks provided to said first and second matched filters are occasionally changed to each other.

18. A matched filter system as claimed in claim 8, wherein said matched filter circuits are classified into groups, and outputs from said matched filter circuits of each said group are added by an addition circuit, and outputs of said addition circuit are added by an addition circuit.

* * * * *